United States Patent
Schaller et al.

(10) Patent No.: US 10,854,491 B2
(45) Date of Patent: Dec. 1, 2020

(54) DYNAMIC LEVELING PROCESS HEATER LIFT

(71) Applicant: Applied Materials, Inc., Santa Clara, CA (US)

(72) Inventors: Jason M. Schaller, Austin, TX (US); Michael Rohrer, Cedar Park, TX (US); Tuan Anh Nguyen, San Jose, CA (US); William Tyler Weaver, Austin, TX (US); Gregory John Freeman, Austin, TX (US); Robert Brent Vopat, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/357,101

(22) Filed: Mar. 18, 2019

(65) Prior Publication Data

US 2019/0229004 A1      Jul. 25, 2019

Related U.S. Application Data

(62) Division of application No. 15/705,031, filed on Sep. 14, 2017, now Pat. No. 10,249,525.

(Continued)

(51) Int. Cl.
  *H01L 21/68*   (2006.01)
  *C23C 16/458*  (2006.01)
  (Continued)

(52) U.S. Cl.
  CPC .......... *H01L 21/68* (2013.01); *C23C 16/458* (2013.01); *C23C 16/4584* (2013.01);
  (Continued)

(58) Field of Classification Search
  CPC .............................. H01L 21/022; H01L 21/68
  See application file for complete search history.

(56) References Cited

U.S. PATENT DOCUMENTS

2003/0044529 A1   3/2003   Wu et al.
2003/0136520 A1   7/2003   Yudovsky et al.
(Continued)

FOREIGN PATENT DOCUMENTS

JP    2006-324550 A   11/2006
KR   10-2004-0022278 A    3/2004
WO    2012-134663 A2  10/2012

OTHER PUBLICATIONS

International Search Report dated Dec. 27, 2017 for Application No. PCT/US2017/052023.

(Continued)

*Primary Examiner* — Caridad Everhart
*Assistant Examiner* — Ankush K Singal
(74) *Attorney, Agent, or Firm* — Patterson + Sheridan, LLP

(57) ABSTRACT

A method and apparatus for of improving processing results in a processing chamber by orienting a substrate support relative to a surface within the processing chamber. The method comprising orienting a supporting surface of a substrate support in a first orientation relative to an output surface of a showerhead, where the first orientation of the supporting surface relative to the output surface is not coplanar, and depositing a first layer of material on a substrate disposed on the supporting surface that is oriented in the first orientation.

11 Claims, 8 Drawing Sheets

Related U.S. Application Data

(60) Provisional application No. 62/403,684, filed on Oct. 3, 2016.

(51) Int. Cl.
  *H01L 21/687* (2006.01)
  *H01L 21/67* (2006.01)
  *C23C 16/455* (2006.01)
  *C23C 16/52* (2006.01)
  *G05B 19/418* (2006.01)
  *H01L 21/02* (2006.01)

(52) U.S. Cl.
  CPC ........ *C23C 16/45565* (2013.01); *C23C 16/52* (2013.01); *G05B 19/418* (2013.01); *H01L 21/022* (2013.01); *H01L 21/02271* (2013.01); *H01L 21/67103* (2013.01); *H01L 21/68742* (2013.01); *H01L 21/68764* (2013.01); *H01L 21/68785* (2013.01); *H01L 21/68792* (2013.01); *G05B 2219/45031* (2013.01)

(56) References Cited

U.S. PATENT DOCUMENTS

| | | |
|---|---|---|
| 2003/0183611 A1 | 10/2003 | Gregor et al. |
| 2004/0244694 A1* | 12/2004 | Hayashi ............ H01L 21/68742 118/728 |
| 2005/0260345 A1 | 11/2005 | Lubomirsky et al. |
| 2008/0084649 A1 | 4/2008 | Chang et al. |
| 2009/0081365 A1* | 3/2009 | Cok ...................... C23C 14/243 427/255.6 |
| 2012/0244704 A1 | 9/2012 | Kao et al. |
| 2017/0346044 A1* | 11/2017 | Bangert ................ C23C 14/042 |
| 2018/0061650 A1* | 3/2018 | Mahorowala ....... H01L 21/3065 |
| 2018/0245206 A1* | 8/2018 | Bangert ................ C23C 14/243 |
| 2019/0032194 A2* | 1/2019 | Dieguez-Campo ..... H01L 51/56 |
| 2019/0080903 A1* | 3/2019 | Abel ................ H01L 21/02219 |

OTHER PUBLICATIONS

KR Office Action dated Sep. 27, 2020 for Application No. 10-2019-7012784.

* cited by examiner

DYNAMIC LEVELING PROCESS HEATER LIFT

CROSS-REFERENCE TO RELATED APPLICATIONS

This application is a divisional of co-pending U.S. patent application Ser. No. 15/705,031, filed Sep. 14, 2017, which claims benefit to Provisional Patent Application Ser. No. 62/403,684, filed on Oct. 3, 2016, both application are hereby incorporated herein by reference.

BACKGROUND

Field

Embodiments of the present disclosure generally relate to an apparatus and method of processing a substrate within a semiconductor processing chamber.

Description of the Related Art

Semiconductor processing systems are used to form semiconductor devices by depositing, etching, patterning and treating thin films and coatings. A conventional semiconductor processing system contains one or more processing chambers and a means for moving a substrate between them. A substrate may be transferred by a robotic arm which can extend to pick up the substrate, retract and then extend again to position the substrate in a different position within the processing chamber. Each processing chamber typically has a pedestal or some equivalent way of supporting the substrate for processing.

A pedestal may be configured to provide heat to a substrate during processing. The substrate may be held by a mechanical, pressure differential or electrostatic means to the pedestal during processing. When on the pedestal, one or more processes may be performed on the substrate, which may include depositing, etching and/or thermally treating a film formed thereon.

Most semiconductor device formation processes are improved when the uniformity of the processes performed on the substrate surface is improved. One of the parameters which may affect uniformity of a deposition, etching or thermal treatment process is the position of the substrate relative to one or more of the chamber components found in the processing chamber, such as a showerhead, during processing. As a result, processing systems are typically designed to provide a parallel, uniform and reproducible placement of substrates relative to the one or more of the chamber components in the processing chamber during one or more of the processing steps.

Oxide and Nitride chemical vapor deposition processes each have a different uniformity response to a pedestal's tilt and position relative to the one or more of the chamber components, such as the showerhead. These materials are deposited in the same chamber in an alternating process that layers oxide and nitride films. To assure optimal process results, each layer requires an independently tuned pedestal tilt and position relative to the showerhead to achieve the best process results. Currently the pedestal position and orientation is manually adjusted (tilted) for only the most sensitive deposition material and the other layer's uniformity is not optimized. Therefore, there is a need for an automated multi-position tilt mechanism for positioning the pedestal within a process chamber.

Therefore, there is a need in the art for an apparatus and method of processing a substrate within a semiconductor processing chamber.

SUMMARY

The present disclosure generally provides for a method and apparatus for of improving processing results in a processing chamber by orienting a substrate support relative to a surface within the processing chamber.

Embodiments disclosed herein include a method of processing a substrate in a processing chamber comprising orienting a substrate supporting surface of a substrate support in a first orientation relative to an output surface of a showerhead where the first orientation of the substrate supporting surface relative to the output surface is not coplanar. The method further comprising depositing a first layer of material on a substrate disposed on the substrate supporting surface while the substrate supporting surface is oriented in the first orientation.

In another embodiment, a method of processing a substrate support in a processing chamber comprising serially changing an orientation of a substrate supporting surface of a substrate support relative to an output surface of a showerhead where the orientation of the substrate supporting surface relative to the output surface is not coplanar while the orientation is serially changed. The method further comprising depositing a first layer of material on a substrate disposed on the substrate supporting surface where the orientation of the substrate supporting surface is serially changing.

In another embodiment, a substrate support assembly comprising a support member that supports a pedestal having a substrate support surface, a carrier plate attached to the support member. The substrate support assembly further comprises a positioning system having a base plate and two or more servo motor assemblies that are coupled to the base plate and the carrier plate where each of the servo motor assemblies have a motor and a linear actuator.

DETAILED DESCRIPTION

Figure 1:
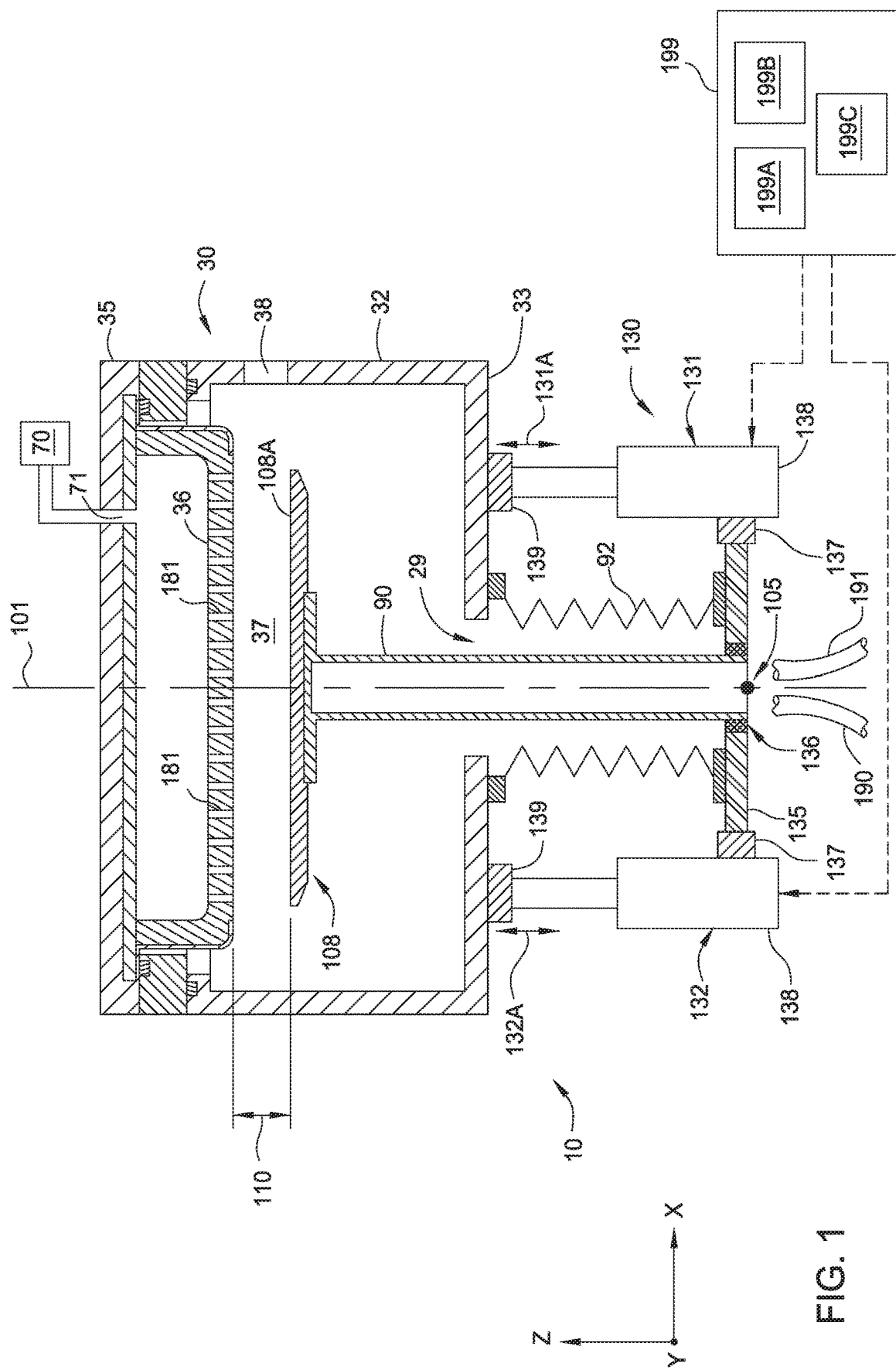
FIG. 1 is a side cross sectional view of a chamber assembly.

FIG. 1 depicts an exemplary chamber assembly 10 that may be used to perform some part of a semiconductor device processing step, according to an embodiment of the disclosure provided herein. Referring to FIG. 1, the chamber assembly 10 may include a processing chamber 30 and substrate support assembly 130 for lifting and positioning a substrate within the processing chamber 30. The substrate support assembly 130 generally includes a pedestal 108 that is coupled to a support member 90, which is partially disposed within processing chamber 30. The substrate support assembly 130 is generally adapted to be moved vertically in a direction that is parallel to a center axis 101, which extends through chamber opening 29 in chamber base 33, by two or more servo motor assemblies 131 and 132. Flexible sealing member 92, such as a bellows assembly, provides a seal between substrate support assembly 130 and processing chamber 30 and allows the chamber to be maintained at a desired pressure, such as vacuum pressure.

The processing chamber 30 includes an outer chamber wall 32, a lower chamber base 33 and a cover 35, which is disposed at the top of the processing chamber 30 and opposite to the base 33. The base 33, cover 35, and wall 32 are also collectively referred to herein as the wall 32. The processing chamber 30 includes a showerhead 36 suspended from cover 35 and projecting downward from cover 35 into the processing chamber 30. A slit valve opening 38 in the wall 32 permits the introduction of an object such as a substrate or wafer (not shown) into the processing chamber 30. The wafer is positioned on the top surface 108A of pedestal 108 in preparation for processing. Gas supply source 70 provides a process gas or gasses through opening 71 within cover 35 and through openings 181 of showerhead 36 to process region 37. In one example, processing chamber 30 represents a Chemical Vapor Deposition (CVD) chamber, but the present invention has application with other processing chambers and processes such as physical vapor deposition processes, etch processes and others which require movement of a support member within an enclosure.

Pedestal 108 and support member 90 are coupled to a carrier plate 135 by a clamp 136. An angular rotational coupling, for example spherical ball joint 137, couple the carrier plate 135 to the servo motor assemblies 131 and 132 disposed below processing chamber 30. Flexible sealing member 92 is fixed to the carrier plate 135 and the base 33. The servo motor assemblies 131 and 132 may include a ball screw driven linear motion guided actuator for providing precision linear travel in a desired direction (e.g., Z-direction) with a desired positional resolution, such as a resolution of less than 0.001". A joint having only one rotational degree of freedom, for example Pivot joints 139, connect the servo motor assemblies 131 and 132 to chamber bottom 33 and further secure the substrate support assembly 130 to the chamber bottom 33. Electrical lines 190 and fluid lines 191 are disposed through support member 90 and are attached to components within the pedestal 108 to provide coolant and electrical power to these components within the pedestal 108. Typically, the servo motor assemblies 131 and 132 are connected to the bottom of the processing chamber 30 and each include a drive assembly and encoder assembly for determining the position of components within the apparatus that are in communication with a system controller 199. Preferably, the drive assemblies within the servo motor assemblies 131 and 132 include servo motors 138, although other motion actuator assemblies may be used without departing from the scope of the disclosure provided herein.

In operation, system controller 199 causes the servo motors 138 to drive carrier plate 135 in a linear direction 131A and 132A to position the pedestal 108 at a desired processing location relative to showerhead 36 or wafer transfer location relative to slit valve opening 38 within the processing region 37. Servo motor assemblies 131 and 132 can raise and lower the pedestal 108 on a level plane (e.g., parallel to the X-Y plane) relative to showerhead 36 when the servo motor assemblies 131 and 132 are driven at the same time with the same velocity relative to the Z axis, or parallel along center axis 101, such that the distance 110 between showerhead 36 and pedestal 108 is the same across top surface 108A.

During processing, the deposition process begins when system controller 199 signals the gas supply source 70 to deliver process gasses through the openings 181 in the showerhead 36 and into the processing region 37. As will be further discussed below, in reference to FIG. 2, servo motors assemblies 131 and 132 may also be independently controlled to statically or dynamically manipulate the orientation (e.g., tilt) of the pedestal 108 relative to showerhead 36 to increase process uniformity across a substrate.

The controller 199 may include a central processing unit (CPU) 199A, memory 199B, and support circuits (or I/O) 199C. The CPU may be one of any form of computer processors that are used in industrial settings for controlling various processes and hardware (e.g., pattern generators, motors, and other hardware) and monitor the processes (e.g., processing time and substrate position or location). The memory (not shown) is connected to the CPU, and may be one or more of a readily available memory, such as random access memory (RAM), read only memory (ROM), floppy disk, hard disk, or any other form of digital storage, local or remote. Software instructions, algorithms and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. The program may be software readable by the controller and may include code to monitor and control, for example, the processing time and substrate position or location.

Figure 2:
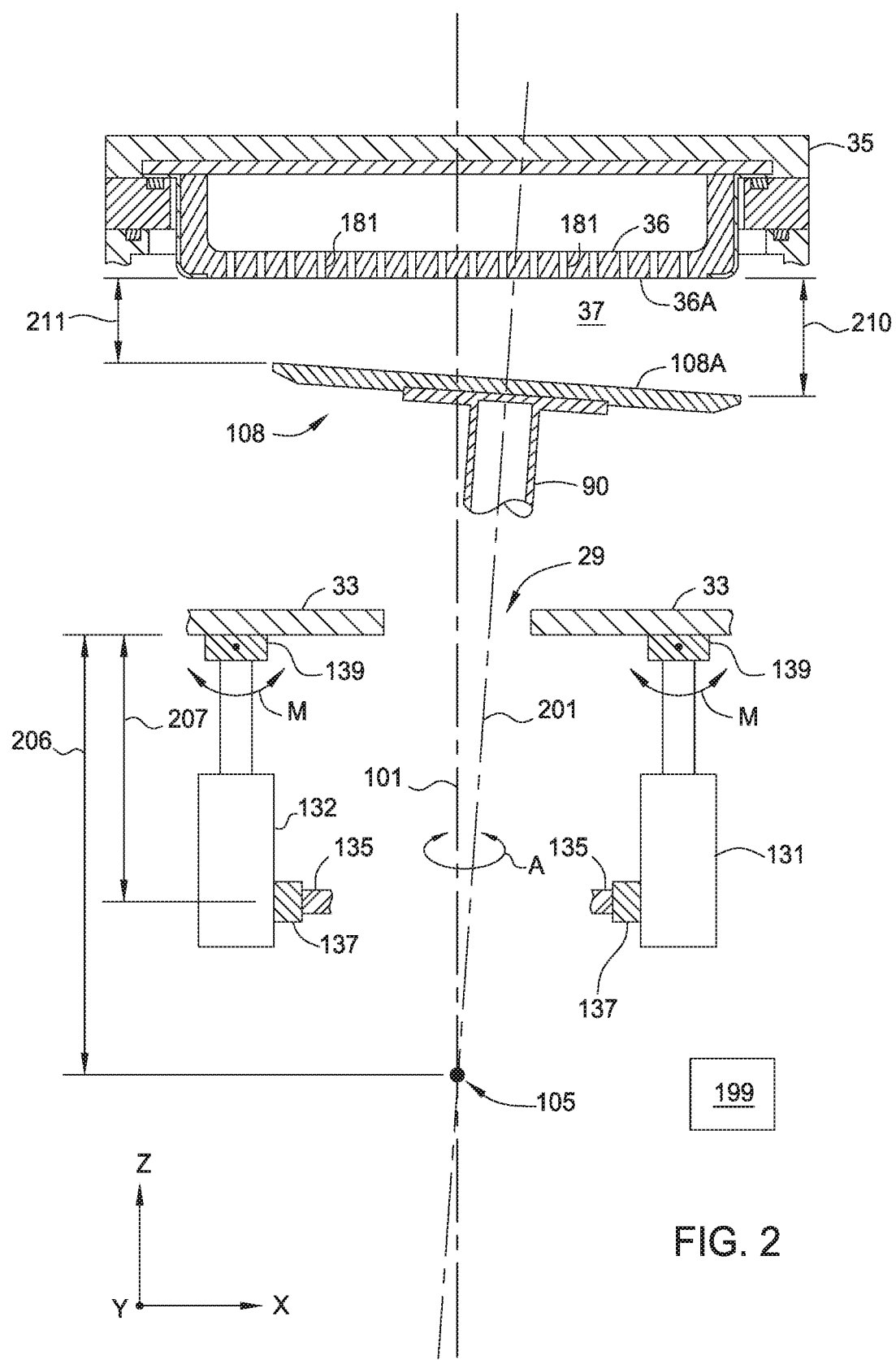
FIG. 2 is a side cross sectional view of a chamber assembly.

Referring to FIG. 2, to accommodate process steps where the orientation of the pedestal effects the uniformity of a process performed on an exposed surface of a substrate, the system controller 199 can cause two or more servo motor assemblies 131 and 132 to drive at different velocities, in different directions and/or to different vertical positions to manipulate the position and/or orientation of the carrier plate 135 relative to the showerhead 36, which can result in a tilt of the support member 90 and pedestal 108 about a pivot point 105 relative to the center axis 101. FIG. 2 generally depicts a modified position of the pedestal 108 relative to the showerhead 36 so as to improve the uniformity of a semiconductor fabrication process that is sensitive to the orientation of the pedestal 108 to the showerhead 36. The tilted axis 201 of the pedestal 108 is shown tilted relative to center axis 101 of the chamber opening 29 about a pivot point 105, which results in a greater distance 210 and lesser distance 211 between the opposite outer edges of the top surface 108A relative to the surface 36A of the showerhead 36. Spherical ball joints 137 provide for movement between the carrier plate 135 and servo motor assemblies 131 and 132. Pivot joints 139, which are attached to base 33 and to servo motor assemblies 131 and 132, flex due to the generated moment M created by the differing motion of the servo motor assemblies 131 and 132 that causes the support member 90 to pivot in a direction relative to center axis 101.

The flexing of the pivot joints 139 allow for the rotation and displacement of the support member 90 coupled to carrier plate 135. In operation, as the servo motor assemblies move the carrier plate 135 vertically, for example, from a distance 206 from base 33 to a distance 207 from base 33, the pivot point 105 will be also move to a position relative to the distance the carrier plate 135 moved from the position at distance 206. In this way, the pedestal 108 position and amount of tilt relative to the center axis 101 can be automatically modified for each individual process step and film layer to optimize the uniformity of each deposited layer dependent of the film stack. It should be noted that servo motor assemblies illustrated in FIG. 2 need not be in the same plane (e.g., not in the X-Z plane), and in some cases three or more servo motor assemblies may be distributed in various angular orientations relative to the center axis 101, as shown in FIG. 3A.

Figure 3A:
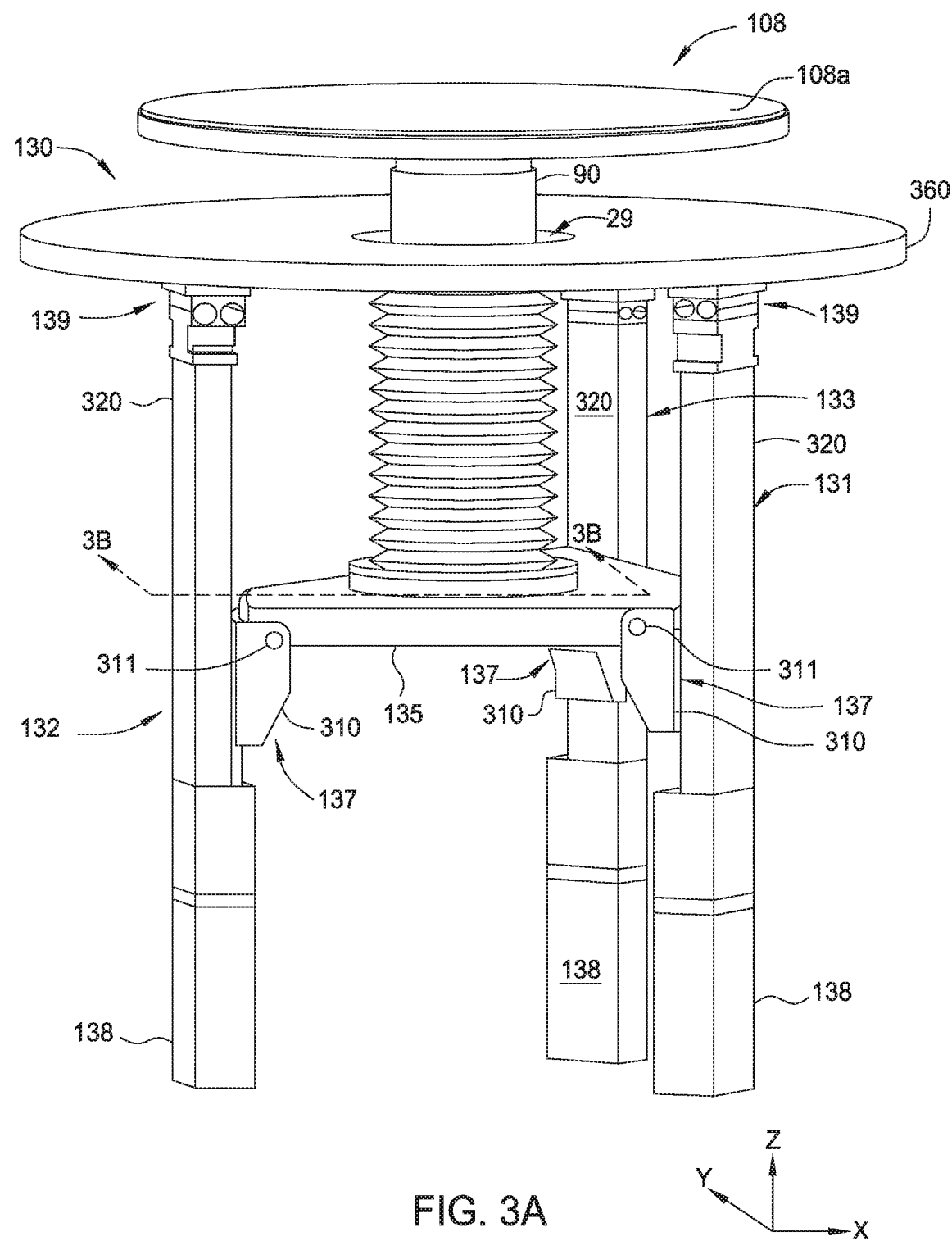
FIG. 3A is an isometric view of a substrate support assembly.

Referring now to FIG. 3A, in one embodiment, substrate support assembly 130 includes three servo motor assemblies 131, 132 and 133 that are each attached to base plate 360 via pivot joints 139 and to the carrier plate 135 via a spherical ball joint 137. Base plate 360 facilitates easy mounting of the substrate support assembly 130 to the bottom of the processing chamber 30. Pedestal 108 is mounted to support member 90 which is positioned through chamber opening 29 in the center of base plate 360. Support member 90 is coupled to the carrier plate 135. Flexible sealing member 92 is mounted outside the processing chamber 30 and provides a seal between base plate 360 and carrier plate 135 and allows the processing chamber 30 to be maintained under a pressure that is typically below atmospheric pressure. The spherical ball joints 137 include joint housing 310 connected to linear actuators 320 and the bearing pins 311 connect the bearing joints to the carrier plate 135. Spherical ball joints 137 are discussed in more detail below in reference to FIG. 3B. In some embodiments, the joint housing 310 is attached to a ball screw (not shown) portion of the linear actuator 320. Servo motors 138 drive the ball screw portion of linear actuator 320, and thus drive spherical ball joints 137 and carrier plate 135 in a vertical direction along the guiding elements in the linear actuator 320. Driving the servo motors 138 using the same dynamic motion profiles (e.g., acceleration, velocity, movement length) will result in the orientation of the carrier plate 135 in space to be maintained as it is raised and lowered. However, by driving the servo motors using different dynamic motion profiles will allow for manipulation of the orientation of the carrier plate 135, which can result in the tilt of support member 90 and pedestal 108. Pivot joints 139 are attached to base plate 360 and to servo motor assemblies 131, 132 and 133 to allow the pivot joints 139 to flex as the moments M are created by the motion of the servo motor assemblies 131, 132 and 133.

In one embodiment, in reference to FIG. 2 and FIG. 3A, the substrate support assembly 130 includes three servo motor assemblies 131, 132 and 133 which when driven in a continuously oscillating motion (e.g., back and forth motion) causes the tilted axis 201 to precess about the center axis 101, as represented by movement A (FIG. 2A). In operation, the system controller 199 causes the servo motor assemblies 131, 132 and 133 to continuously move using differing dynamic motion profiles to manipulate the position and/or orientation of the carrier plate 135 and pedestal 108 so that the position and/or orientation of the pedestal 108 will continually vary as it pivots about the pivot point 105 and/or moves along the center axis 101. In one example, the system controller 199 causes the servo motor assemblies 131, 132 and 133 to continuously move using differing dynamic motion profiles to manipulate the orientation of the carrier plate 135 and pedestal 108 so that the orientation of the pedestal 108 relative to the surface 36A of the showerhead 36 and center axis 101 continually varies as it pivots about the pivot point 105. By continuously driving the servo motors the orientation of the pedestal 108 and support member 90 will continuously move in one or more directions relative to a stationary reference frame (e.g., X-Y-Z reference frame). It has been found that a continuous tilt that causes the tilted axis 201 to precess about the center axis 101 for a period of time results in improved process uniformity for the deposition of certain CVD deposited films.

Figure 3B:
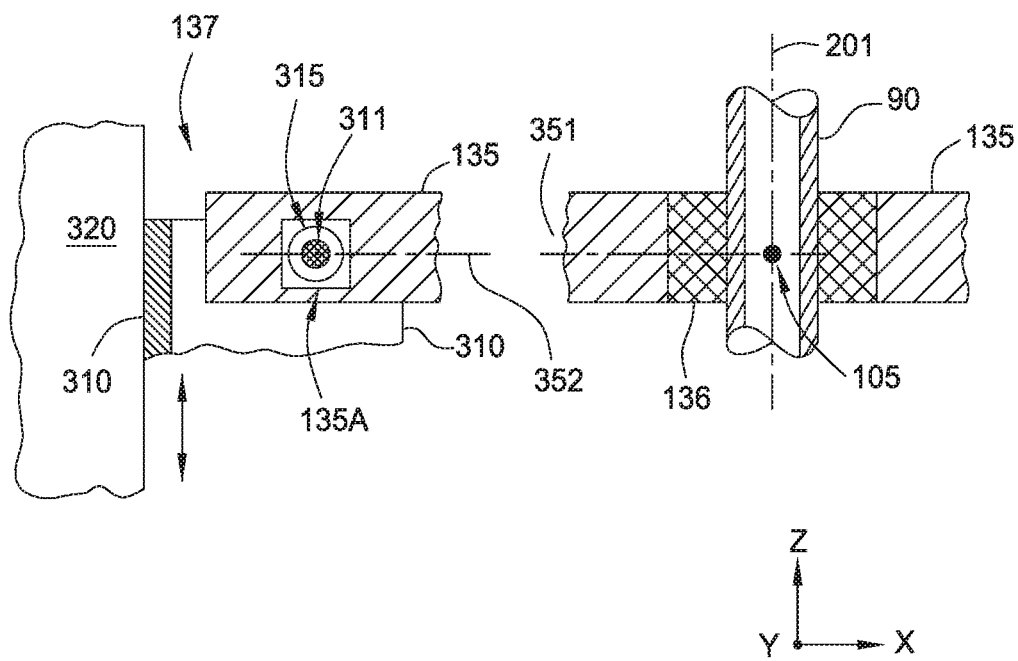
FIG. 3B is a side cross sectional view of a center portion of the carrier plate and sectional joint shown in FIG. 3A.

FIG. 3B is a side cross-sectional view of the spherical ball joint 137 that is connected to the linear actuator 320 and connected to the carrier plate 135, as represented by dashed lines 3B-3B in FIG. 3A. Joint housing 310 is connected to the linear actuator 320 and moves vertically via ball screw (not shown) as discussed above in reference to FIG. 3A. Carrier plate 135 is connected to joint housing 310 by the pin 311 and bearing 315 at the attachment point 135A. The purpose of bearing 315 within spherical ball joint 137 is to allow for three degrees of freedom (pitch, yaw and roll) about the attachment point 135A. Horizontal line 352 passes through the center axis of pin 311 and horizontal line 351 passes through the center of the clamp 136, and for the configuration of carrier plate 135 shown in FIG. 3A through the pivot point 105. In some embodiments, when horizontal lines 351 and 352 are coplanar, the pivot point 105, which is generated by the motion provided by the servo motor assemblies 131, 132 and 133, will typically be aligned within the horizontal plane containing the coplanar lines 351 and 352 and on the center axis 101. In other embodiments, when horizontal lines 351 and 352 are each found within different horizontal planes (e.g., different X-Y planes), or where the center axis of pin 311 and axis of the clamp 136 are not collinear, the pivot point 105 will be offset from the horizontal plane that contains the line 351. In an alternative embodiment, the combination of three servo motor assemblies configured in opposing support locations fully constrain the carrier plate 135 motion while giving the substrate support assembly 130 the flexibility to move in 4 degrees of freedom (elevation, pitch, yaw and roll).

Figure 3C:
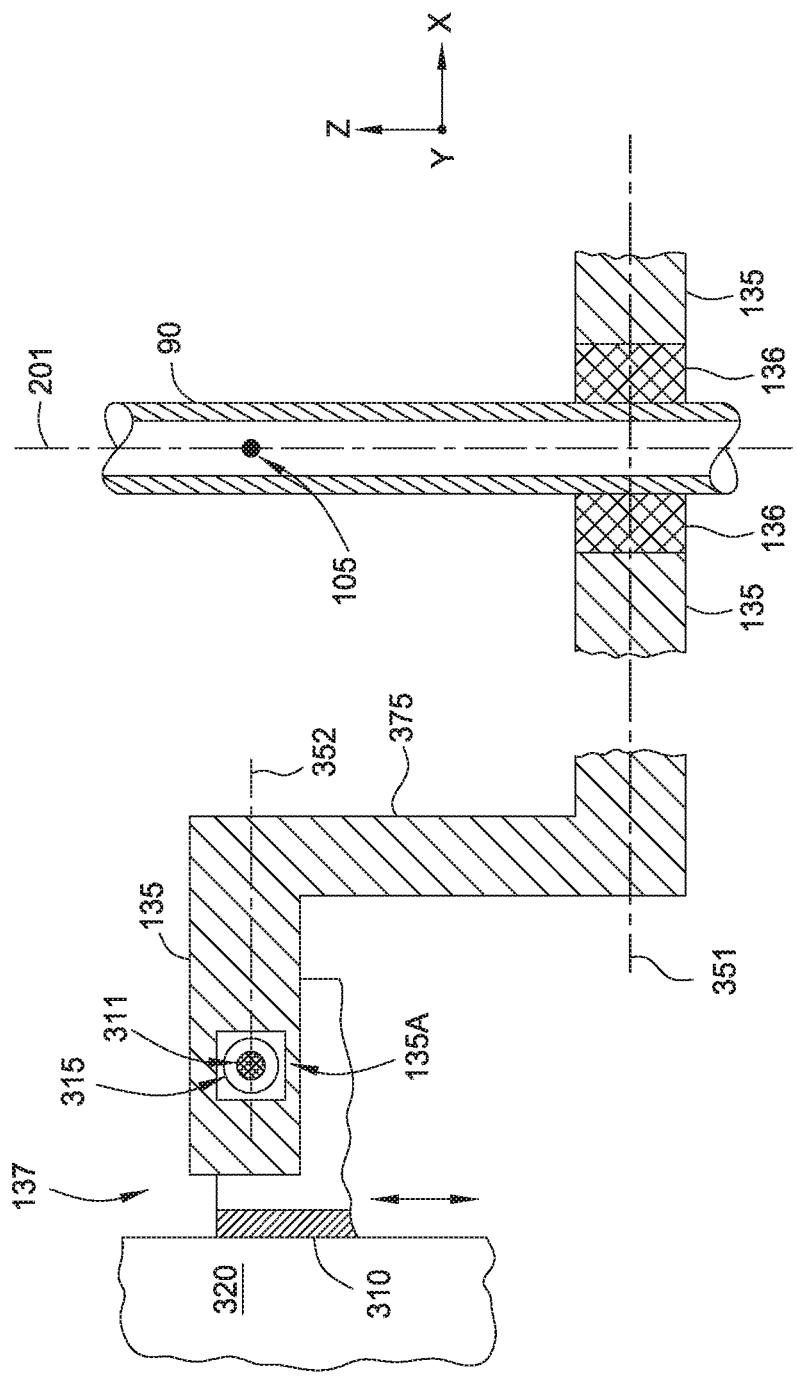
FIG. 3C is a side cross sectional view of one embodiment of a portion of the carrier plate and sectional joint.

FIG. 3C shows another embodiment of the carrier plate 135 in which the configuration of the pin 311 of the spherical ball joint 137 is offset relative to the clamp 136. In this configuration, the carrier plate 135 includes vertical walls 375 that couple the clamp region of the carrier plate 135 to the spherical ball joint region, or attachment point 135A region, of the carrier plate 135. This configuration of the carrier plate 135 positions the attachment point 135A a distance from the clamp 136, as compared to the configuration shown in FIG. 3B. In this embodiment, horizontal line 352 passing through the center point of pin 311 is positioned higher along the z axis than the horizontal line 351 passing through the center point of the location where the lower portion of carrier plate 135 and support member 90 attach to the linear actuator 320 of the servo motor assemblies. In this configuration, typically the pivot point 105 remains on the same plane as the center axis of pin 311 and because pivot point 105 is a distance above line 351, the spherical ball joints travel a shorter distance along linear actuators to achieve the same degree of tilt of tilted axis 201 as would be required when lines 351 and 352 are coplanar, as shown in FIG. 3B. The shorter the distance that the spherical ball joints travels results in less wear on moving parts including servo motors, ball screws and pivot joints. This becomes especially important in one embodiment when the servo motors are driven continuously providing a continuously rotating tilt of pedestal 108 for a period of time during the deposition process, as discussed above in reference to FIGS. 2 and 3A. In some embodiments, the servo motors assemblies 131, 132, and 133 are driven serially and the substrate supporting top surface 108A is serially changed relative to the output surface 36A of the showerhead 36 for a period of time during the deposition process. Therefore, in some embodiments, the pivot point 105 can be adjusted by altering the configuration of the carrier plate 135, or joint housing 310, such that the position of the pin 311 relative to the center of the clamp 136 are at a desired distance apart in the vertical direction (e.g., Z-direction).

Figure 4:
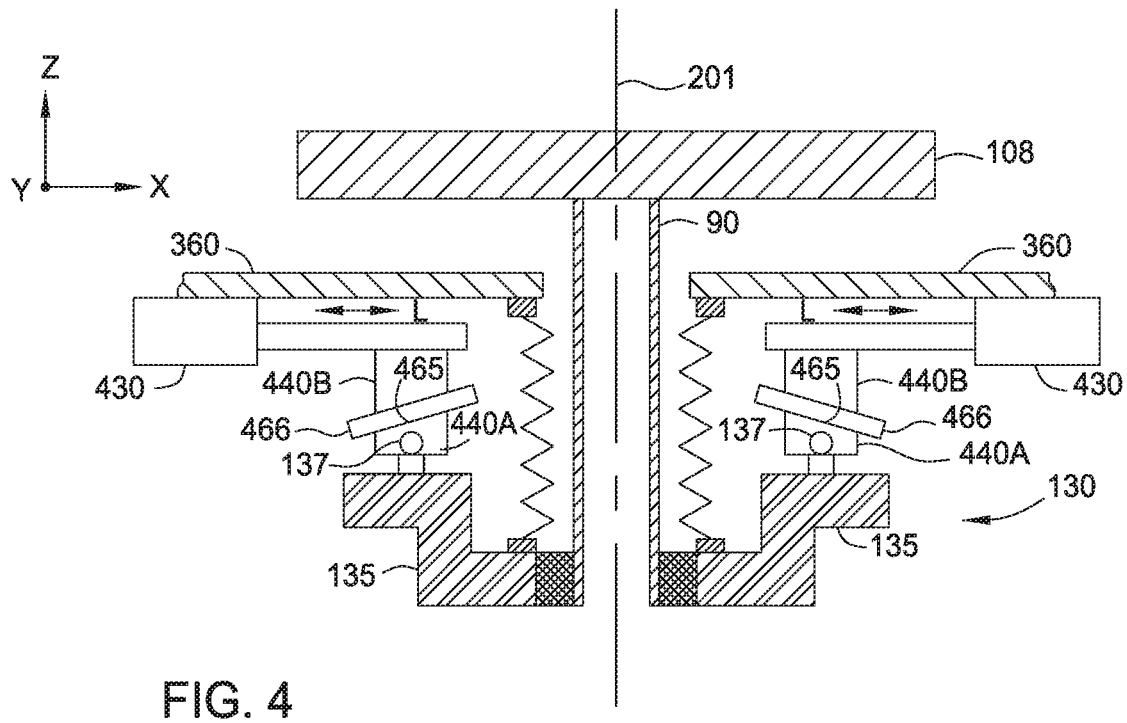
FIG. 4 is a side cross sectional view of one embodiment of a substrate support assembly.

FIG. 4 shows one embodiment of substrate support assembly 130 using linear motors 430 that are oriented radially in combination with angled blocks 440A and 440B and spherical ball joints 137. Spherical ball joints 137 are connected to angled blocks 440A that are positioned on the upper outer edge of carrier plate 135. The angled side edge 465 of the angled block 440A is positioned facing away from the support member 90 and in a direction towards linear motor 430. Linear motor 430 is connected to angled blocks 440B. The angled side edge 465 of angled bock 440B is positioned facing at an angle towards support member 90 and carrier plate 135. Linear bearing 466 is positioned between the angled sides 465 of angled blocks 440A and 440B. The stacking of angled block 440A, linear bearing 466 and angled block 440B redirects the linear motion L of the horizontally mounted linear motor 430 in a vertical direction through angled block 440A and 440B and linear bearing 466 to the spherical ball joint 137 and carrier plate 135 resulting in a change in the position and/or orientation of support member 90.

Figure 5:
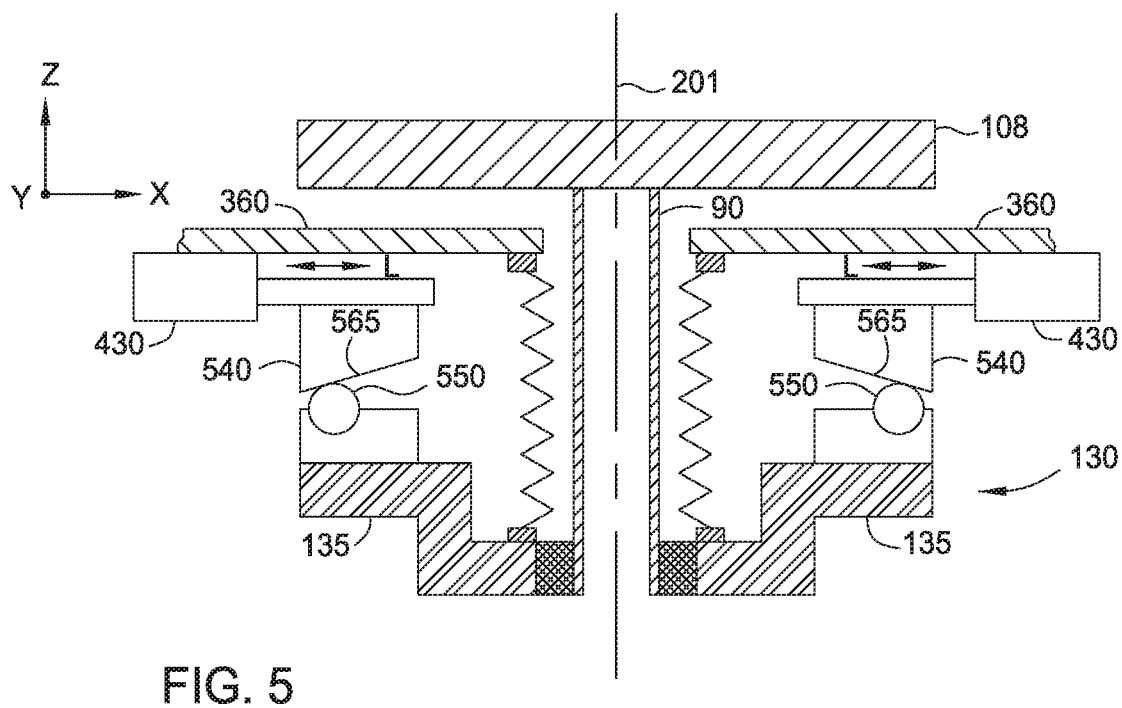
FIG. 5 is a side cross sectional view of one embodiment of a substrate support assembly.

FIG. 5 shows one embodiment of substrate support assembly 130 using linear motors 430 spaced radially in a horizontal position in combination with V-blocks 540 and ball transfer joints 550. V-block 540 has a v-shaped groove (not shown) along the angled face 565 of the V-block. The angled face 565 of the V-block 540 is positioned facing at an angle towards support member 90, ball transfer joint 550 and carrier plate 135. The ball of ball transfer joint 550 rolls or slides within the V-grove (not shown) on the surface of the angled side of the V-block. Linear motor 430 drives V-block 540 in horizontal direction L. The positioning of V-block 540 over ball transfer joint 550 redirects the linear motion L of the horizontally mounted linear motor 430 in a vertical direction through V-block 540 to ball transfer joint 550 and carrier plate 135 resulting in a change in the position and/or orientation of support member 90.

Figure 6:
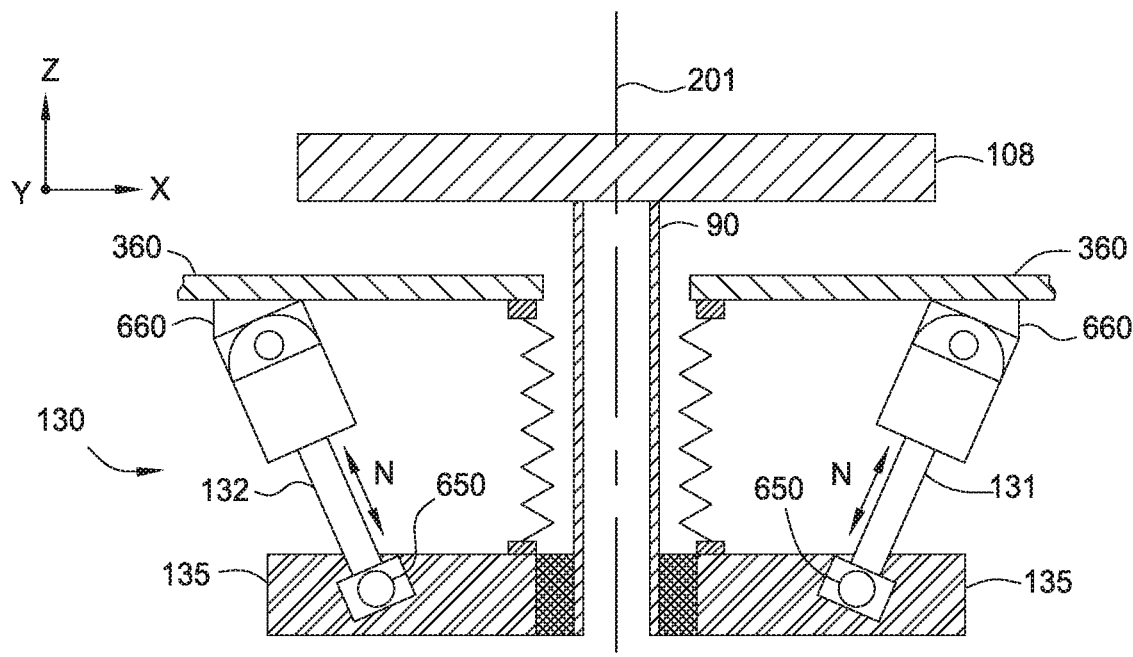
FIG. 6 is a side cross sectional view of one embodiment of a substrate support assembly.

FIG. 6 shows one embodiment of substrate support assembly 130 using a servo motor assembly 131 and 132 including ball screws connected to the carrier plate 135 by hinge joint 650. Universal joint 660 mounts servo motor assembly 132 to base plate 360. Servo motor assembly 132 drives the ball screw in direction N to change the orientation of carrier plate 135 resulting in a change in the position and/or orientation of support member 90 around tilted axis 201.

Figure 7:
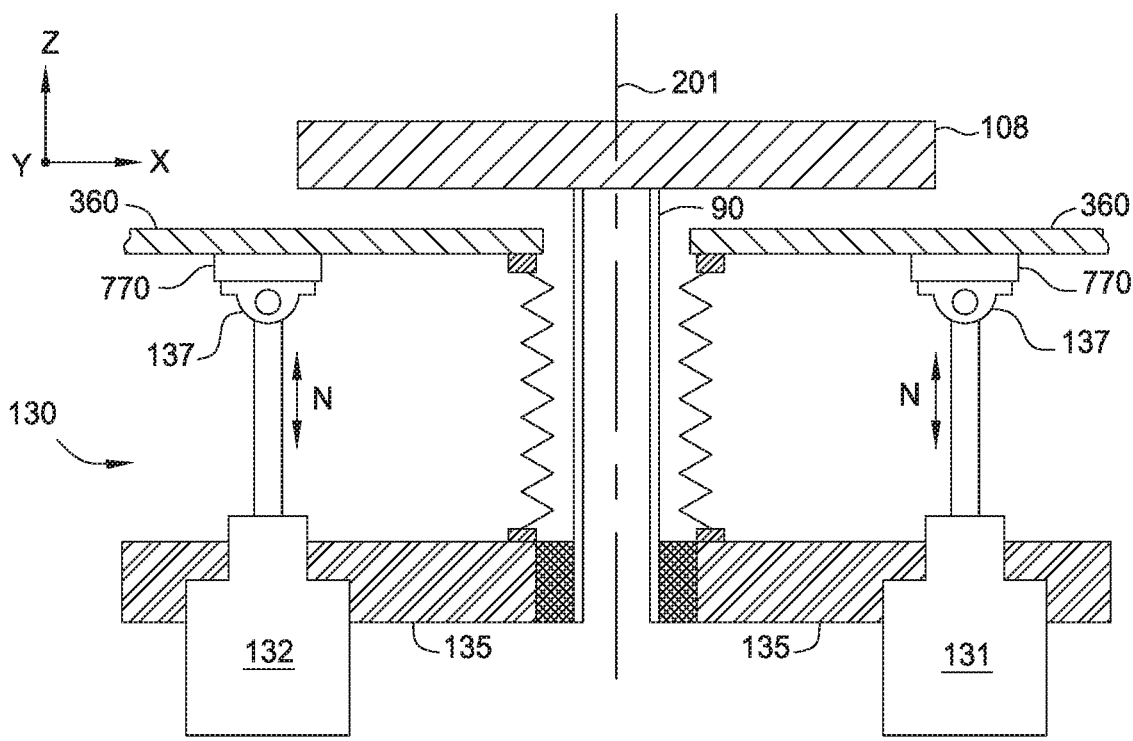
FIG. 7 is a side cross sectional view of one embodiment of a substrate support assembly.

FIG. 7 shows one embodiment of substrate support assembly 130 using servo motor assembly 131 and 132 mounted to the carrier plate 135 and connected to base plate 360 via spherical ball joint 137. Servo motor assembly 132 drives ball screw in direction N. Spherical ball joint 137 allows the ball screw to pivot against linear bearing 770 and base plate 360 resulting in a change in the position and/or orientation of support member 90 around tilted axis 201.

Figure 8:
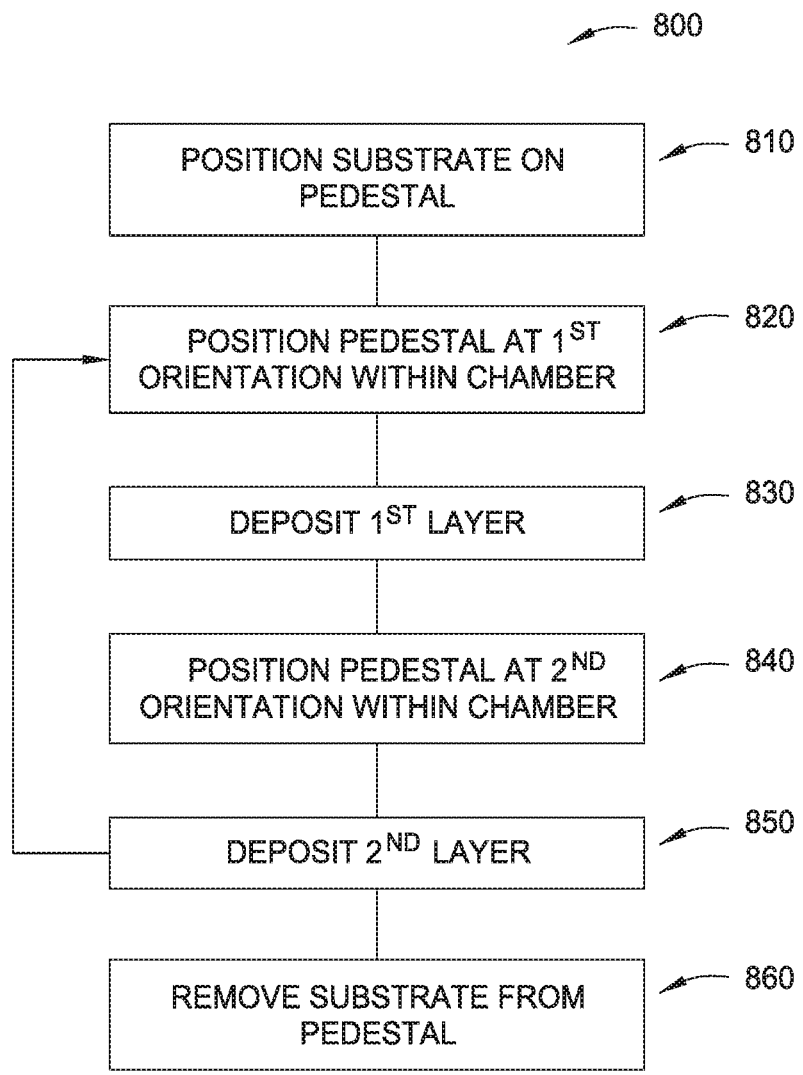
FIG. 8 is flow chart showing one embodiment of a process used to achieve the invention.

FIG. 8 shows one method 800 for improving the uniformity of stacked layers within a deposition chamber. At block 810, and in reference to FIG. 1, the wafer is directed through slit valve opening 38 of processing chamber 30 and placed on the top surface 108A of the pedestal 108. At block 820, pedestal 108 is positioned at a first orientation within the processing chamber 30, the orientation of top surface 108A of pedestal 108 in relation to showerhead 36 so as to provide improved deposition uniformity across the wafer for the particular deposition process. At block 830 the layer is deposited on the wafer using the desired deposition process. At block 840, pedestal 108 is positioned at a second orientation within the processing chamber; the orientation of the top surface 108A of pedestal 108 in relation to showerhead 36 is used to provide improved deposition uniformity across the wafer for the second layer to be deposited. At block 850, the second layer is deposited on the uniformly deposited first layer. Blocks 810 to 850 may then be repeated any number of times to achieve the prescribed number of uniformly deposited layers. At block 860, the substrate is removed from the pedestal and removed from processing chamber 30.

It will also be recognized by those skilled in the art that, while the inventions has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

What is claimed is:

1. A method of processing a substrate in a processing chamber, comprising:
   orienting a substrate supporting surface of a substrate support in a first orientation relative to an output surface of a showerhead, wherein the first orientation of the substrate supporting surface relative to the output surface is not parallel; and
   depositing a first layer of material on a substrate disposed on the substrate supporting surface while the substrate supporting surface is oriented in the first orientation;
   orienting the substrate supporting surface relative to the output surface at a second orientation, wherein the second orientation of the substrate supporting surface relative to the output surface is not parallel; and
   depositing a second layer of material according to a second deposition process.

2. The method of claim 1, wherein orienting the substrate supporting surface further comprises positioning the substrate supporting surface of the substrate support in the first orientation relative to the showerhead using two or more servo motors.

3. The method of claim 2, wherein the servo motors are independently controlled by a controller.

4. The method of claim 3, wherein when positioning the substrate supporting surface, the substrate support supporting surface is moved relative to a center axis of the chamber about a pivot point, wherein the pivot point is below a carrier plate.

5. The method of claim 2, wherein the velocity, the direction or the vertical position of each of the servo motors are adjusted when orienting the substrate supporting surface.

6. A method of processing a substrate support in a processing chamber, the method comprising:

serially changing an orientation of a substrate supporting surface of a substrate support relative to an output surface of a showerhead, wherein the orientation of the substrate supporting surface relative to the output surface is not parallel while the orientation is serially changed, wherein the serially changing the orientation of the substrate supporting surface further comprises serially changing the orientation of the substrate supporting surface relative to the output surface of the showerhead using two or more servo motors; and depositing a first layer of material on a substrate disposed on the substrate supporting surface wherein the orientation of the substrate supporting surface is serially changing.

7. The method of claim 6, wherein the servo motors are independently controlled by a controller.

8. The method of claim 7, wherein when serially changing an orientation of the substrate supporting surface relative to the output surface of a showerhead, the substrate support supporting surface is moved relative to a center axis of the chamber about a pivot point, and wherein the pivot point is below a carrier plate.

9. The method of claim 6, wherein the velocity, the direction or the vertical position of each of the servo motors are adjusted when serially changing an orientation of the substrate supporting surface.

10. A method of processing a substrate in a processing chamber, comprising:

orienting a substrate supporting surface of a substrate support in a first orientation relative to an output surface of a showerhead, wherein the first orientation of the substrate supporting surface relative to the output surface is not parallel; and depositing a first layer of material on a substrate disposed on the substrate supporting surface while the substrate supporting surface is oriented in the first orientation, wherein orienting the substrate supporting surface further comprises positioning the substrate supporting surface of the substrate support in the first orientation relative to the showerhead using two or more servo motors.

11. A method of processing a substrate in a processing chamber, comprising:

orienting a substrate supporting surface of a substrate support in a first orientation relative to an output surface of a showerhead, wherein the first orientation of the substrate supporting surface relative to the output surface is not parallel;

processing a first layer of material on a substrate disposed on the substrate supporting surface while the substrate supporting surface is oriented in the first orientation;

orienting the substrate supporting surface relative to the output surface at a second orientation, wherein the second orientation of the substrate supporting surface relative to the output surface is not parallel; and processing a second layer of material at the second orientation.

* * * * *